United States Patent
Grönninger et al.

(10) Patent No.: US 7,307,284 B2
(45) Date of Patent: Dec. 11, 2007

(54) LUMINESCENT DIODE

(75) Inventors: Günther Grönninger, Seubersdorf (DE); Peter Heidborn, Zeitlam (DE)

(73) Assignee: Osram GmbH, Munich (DE)

(*) Notice: Subject to any disclaimer, the term of this patent is extended or adjusted under 35 U.S.C. 154(b) by 0 days.

(21) Appl. No.: 10/332,259

(22) PCT Filed: May 18, 2001

(86) PCT No.: PCT/DE01/01926

§ 371 (c)(1),
(2), (4) Date: Apr. 15, 2003

(87) PCT Pub. No.: WO02/03476

PCT Pub. Date: Jan. 10, 2002

(65) Prior Publication Data

US 2003/0155576 A1 Aug. 21, 2003

(30) Foreign Application Priority Data

Jul. 5, 2000 (DE) .................. 100 32 531

(51) Int. Cl.
*H01L 27/15* (2006.01)
(52) U.S. Cl. ............................ 257/79; 438/46
(58) Field of Classification Search ............ 438/37, 438/45, 46; 257/22, 29, 86, 101–103, 79
See application file for complete search history.

(56) References Cited

U.S. PATENT DOCUMENTS

| 4,575,742 A |   | 3/1986  | Kohashi et al. |
|-------------|---|---------|----------------|
| 5,153,889 A |   | 10/1992 | Sugawara et al. |
| 5,491,350 A | * | 2/1996  | Unno et al. ............. 257/99 |
| 5,534,717 A |   | 7/1996  | Murasato et al. |
| 5,665,984 A |   | 9/1997  | Hasegawa et al. |

FOREIGN PATENT DOCUMENTS

| DE | 196 30 689 C1 |   | 1/1998 |
|----|---------------|---|--------|
| GB | 2315920 A     | * | 2/1998 |

OTHER PUBLICATIONS

Azoulay, R., Dugrand, L., Ankri, D., Rao, E.V.K.; MOCVD n-type Doping of GaAs and GaAlAs using silicon and selenium and fabrication of double heterostructure bipolar transistor. Sep. 1, 1984, Journal of Crystal Growth, vol. 68, Issue 1, pp. 453-460.*

E. Depraetere et al., "The Photoplastic effect in GaAs, a model for device degradation phenomena", Philosophical Magazine A, vol. 61, No. 6, 1990, pp. 893-907.

(Continued)

*Primary Examiner*—Long Pham
(74) *Attorney, Agent, or Firm*—Cohen Pontani Lieberman & Pavane LLP

(57) ABSTRACT

A light-emitting diode based on GaAlAs has a window layer (5) of reduced thickness and is doped continuously with Si or Sn. The net concentration of the doping is less than $1 \times 10^{18}$ cm$^{-3}$. This provision lessens the degradation of the light-emitting diode (1).

4 Claims, 3 Drawing Sheets

OTHER PUBLICATIONS

E. Munoz-Merino, "DX Centers and III-V Device Performance", Material Research Society Symposium Proceedings, vol. 184, (1990) pp. 49-60.

Y.L. Khait, "Kinetic many-body theory of short-lived large energy fluctuations of small numbers of particles in solids and its applications", Physics Reports, vol. 99 (1983), Nos. 4-5, pp. 237-340.

K. Maeda et al., "Recombination enhanced mobility of dislocations in III-V compounds", Journal de Physique, Paris, vol. 44 (1983), pp. C4-375 to C4-385.

D.V. Lang et al., "A study of deep levels in GaAs by capacitance spectroscopy", Journal of Electronic Materials, vol. 4, No. 5, 1975, pp. 1053-1066.

J. Zhou, et al., "Degradation Mechanism in GaAs LED", Material Research Society Symposium Proceedings, vol. 184, (1990) pp. 145-150.

A.R. Peaker, "Defect energy levels in LPE GaAs", Properties of Gallium Arsenide, INSPEC 1990, 2nd Edition, pp. 323-326.

O. Ueda, "Device-degradation III-V semiconductor lasers and LEDs-influence of defects on the degradation", Material Research Society Symposium Proceedings, vol. 184 (1990), pp. 125-134.

A.S. Jordan et al., "The interplay of thermo-mechanical properties in the growth and processing of III-V materials", Material Research Society Symposium Proceedings, vol. 226 (1991), pp. 117-127.

J. Salzman et al., "Material evolution and gradual degradation in semiconductor lasers and light emitting diodes", Electronics Letters, vol. 25 (1989), No. 3, pp. 244-246.

H.S. Hajghassem et al., "Effects of Neutron Irradiation and Post-Irradiation Annealing on the Radiant Output Power of Infrared Light Emitting Diodes", Material Research Symposium Proceedings, vol. 184 (1990), pp. 151-156.

Mitsuo Fukuda, "Reliability and Degradation of Semiconductor Lasers and LEDs", Artech House, 1991.

* cited by examiner

LUMINESCENT DIODE

This is a U.S. National Phase Application under 35 U.S.C 371 of International Application PCT/DE01/01926, filed on May 18, 2001.

FIELD OF THE INVENTION

The invention relates to a light-emitting diode having a semiconductor chip based on GaAlAs, with a diode layer series amphoterically doped with the aid of silicon, which series has a p-doped anode layer and an n-doped cathode layer, and having a window layer based on GaAlAs adjoining the n-doped cathode layer

BACKGROUND OF THE INVENTION

One such light-emitting diode is known from German Patent DE 196 30 689 C1. The known light-emitting diode is a light-emitting diode that emits infrared light. The light-emitting diode has a first GaAlAs layer doped amphoterically by means of silicon, and this layer comprises a p-conducting partial layer and an n-conductive partial layer disposed over it. The aluminum content in the GaAlAs layer increases steadily and exponentially over the entire GaAlAs layer. At the surface of the p-conducting partial layer, the concentration is 0 atom-%. At the zone of the pn junction, the aluminum concentration has risen to from 5 to 10 atom-%, and at the surface of the n-conducting partial layer it is between 25 and 40 atom-%. The light-emitting diode also has a second, tellurium-doped, n-conducting GaAlAs layer disposed on the top side of the n-conducting partial layer of the first GaAlAs layer. In the second GaAlAs layer as well, the Al content increases steadily and exponentially. Along the boundary face with the first GaAlAs layer, the Al content is between 6 and 16 atom-%. On the opposed surface, the Al content is at least 24 atom-%.

Especially with weak currents, within 1000 hours of operation the light output drops to values less than 30% of the original light output.

SUMMARY OF THE INVENTION

An object of the invention is to create a light-emitting diode with improved degradation performance.

This and other objects are attained in accordance with one aspect of the invention by providing that the thickness of the window layer is between 3 µm and 30 µm, and that the window layer is n-doped with the aid of Si or Sn with a net concentration of less than $1 \times 10^{18}$ cm$^{-3}$.

It has been found that the degradation of the components is much less if the thickness of the window layer is reduced to values between 3 µm and 30 µm, and if tellurium as a dopant is dispensed with. Moreover, the low net concentration of the dopant contributes to the improved degradation performance. The term net concentration is understood to mean the difference in the concentration of donors and acceptors.

DETAILED DESCRIPTION OF THE DRAWINGS

Figure 1:
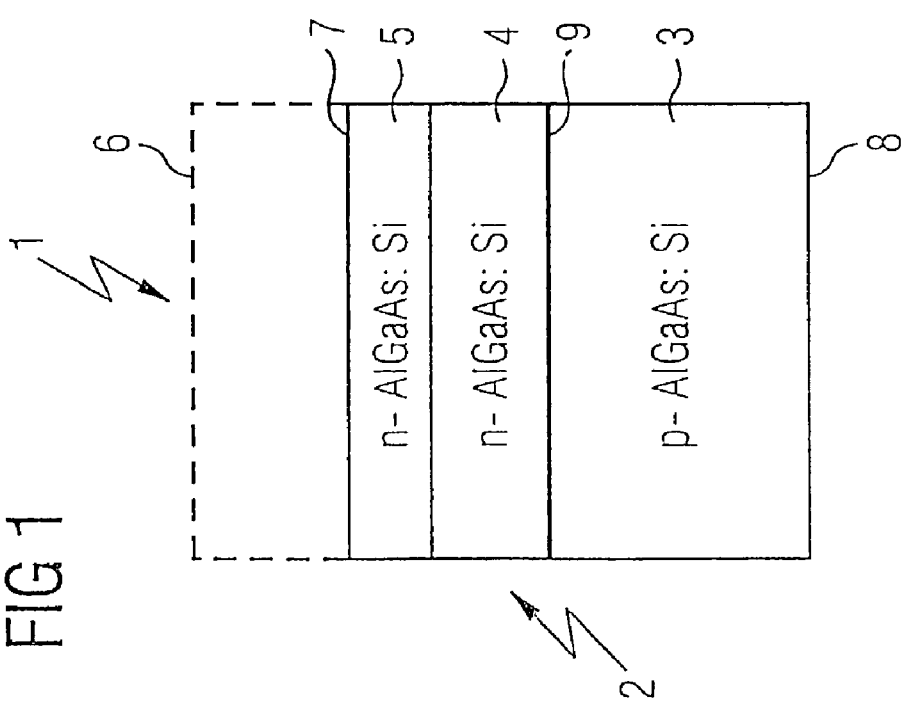
FIG. 1, a cross section through a light-emitting diode of the invention.

In FIG. 1, a light-emitting diode chip 1 is shown, which is suitable in particular for emitting infrared light. The light-emitting diode chip 1 has an amphoterically doped diode layer 2, which is composed of anode layer 3, which is p-doped with the aid of silicon, and a cathode layer 4 that is n-doped with the aid of silicon. The anode layer 3 and the cathode layer 4 are each produced on the basis of AlGaAs. The cathode layer 4 is adjoined by a window layer 5, also n-doped with silicon, on the basis of AlGaAs. Window layer 5 is a layer that is transparent to the generated radiation, such as described in the textbook "Physics of Semiconductor Devices", 2nd ed., page 781, FIG. 30 by S.M. Sze. During the production of the light-emitting diode chip 1, there is a substrate 6 above the window layer 5 that is removed after the epitaxial growth of the window layer 5 and of the diode layer 2. The substrate 6 is therefore drawn in dashed lines in FIG. 1.

In the finished LED 1 of FIG. 1, electrodes, not shown, are mounted on a top side 7 and a bottom side 8. The electrodes serve to direct current via a pn junction 9.

Figure 2:
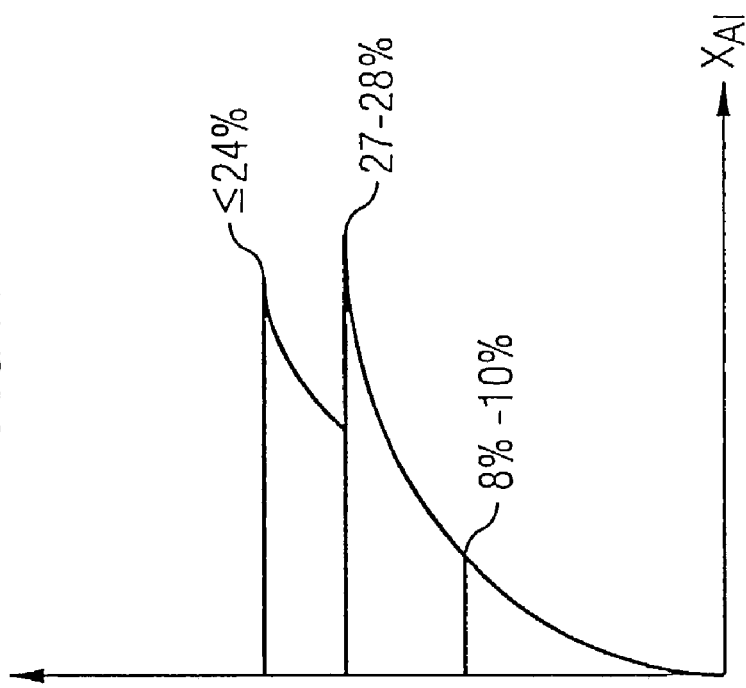
FIG. 2, a graph showing the three-dimensional distribution of the Al concentration in the light-emitting diode of FIG. 1.

In FIG. 2, the local distribution of the Al concentration in the light-emitting diode chip 1 is shown. Along the underside 8, the Al concentration $X_{Al}$ is approximately 0 atom-%. Through the anode layer 3, the Al concentration rises steadily and exponentially, and at the pn junction 9 it reaches values of between 5 and 10 atom-%. In FIG. 2 the narrower range of 8-10 atom-% is shown. Beginning at the pn junction 9, the Al concentration increases still further, to values between 27 and 28 atom-%. In the window layer 5, the Al concentration begins with values of between 6 and 16 atom-%. As the course continues, the Al concentration again increases steadily and exponentially to values up to 24 atom-% at the top side 7 of the light-emitting diode chip 1. Since the size of the bandgap in AlGaAs increases as the Al content increases, the minimum content of Al in the window layer 5 must be above the Al content of the pn junction 9, in order to prevent the photons generated in the pn junction 9 from being absorbed in the window layer 5.

Because of the low aluminum content on the top side 7 of the window layer 5, a good electrical contact can be established between the electrode applied to the window layer 5 and the window layer 5 itself. As a result, the flux voltage can be set to low values, which reduces the power loss in the light-emitting diode chip 1.

The degradation in the intensity of the radiation emitted by the light-emitting diode chip 1 can also be reduced by means of a number of provisions.

First, it is advantageous if the thickness of the window layer 5 is reduced to values between 3 µm and 30 µm, and preferably between 15 and 25 µm. Because of the slight thickness of the window layer 5, the mechanical strain of the semiconductor chip is reduced, thus reducing aging.

In addition, if silicon or tin is used exclusively for doping the semiconductor chip 1, this counteracts degradation. Conversely, using tellurium as a dopant speeds up the degradation.

Finally, the net concentration of the dopant should be less than $1\times10^{18}$ cm$^{-3}$. The term net concentration is understood to mean the difference in concentration of acceptors and donors.

In FIGS. 3-6, the results of various tests are plotted in graphs.

Figure 3:
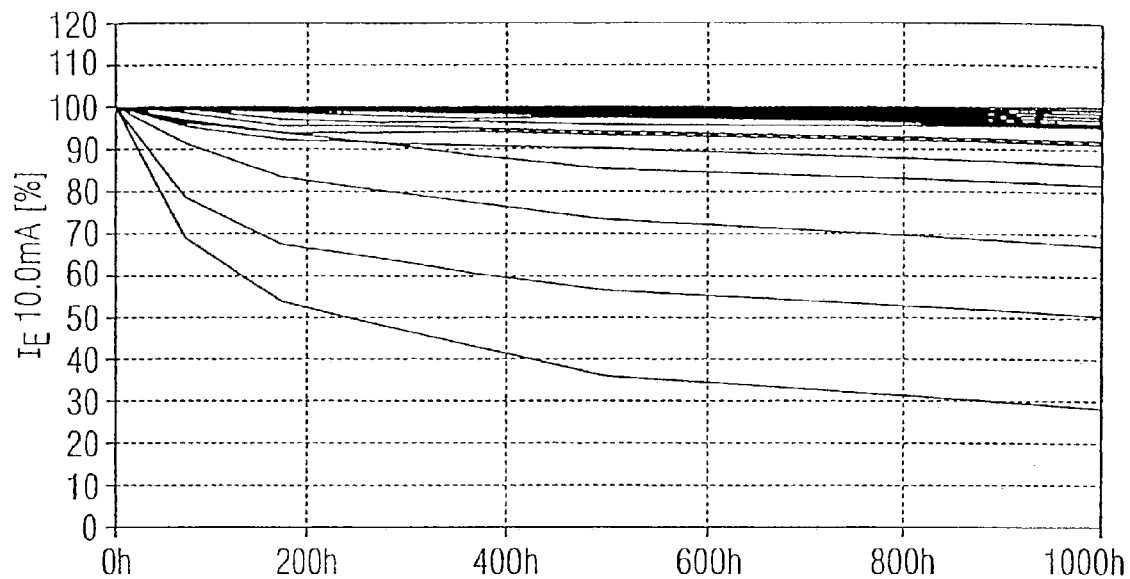
FIG. 3, a graph showing the relative degradation in the radiation intensity in continuous operation of a conventional light-emitting diode.
Figure 4:
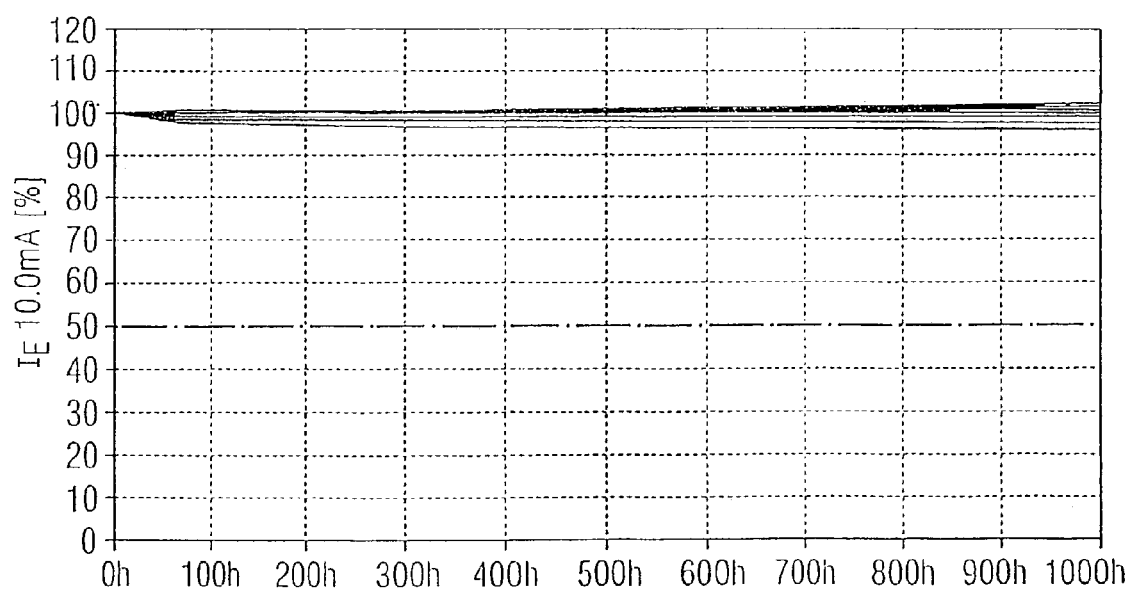
FIG. 4, a graph that shows the relative degradation in the radiation intensity in continuous operation of a light-emitting diode of the invention.

FIGS. 3 and 4 show low-current aging at 7 mA and 25° C.

FIG. 3 shows a graph in which the relative change in radiation intensity in continuous operation of conventional light-emitting diode chips is shown. In the context of these tests, conventional semiconductor chips were operated uninterruptedly over a period of 1000 hours, and the radiation intensity was measured with the aid of a photodiode. It becomes clear from FIG. 3 that in some semiconductor chips, a relative degradation of up to 30% of the initial value occurs.

In contrast to this, the measurements of the light-emitting diode chip 1 of the invention show that even in continuous operation over 1000 hours, no degradation in the radiation intensity occurs. Reducing the window layer thickness and doping exclusively with silicon and tin at a low level also has an advantageous effect on the degradation of the light-emitting diode chip 1.

Figure 5:
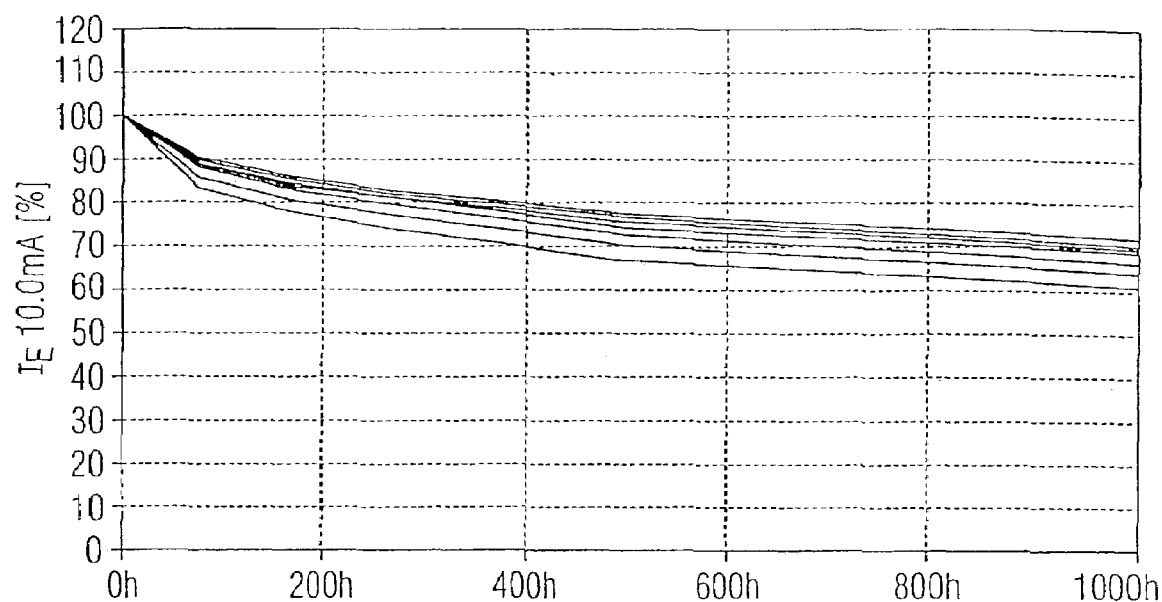
FIG. 5, a graph showing the relative degradation in the radiation intensity in pulsed operation of a conventional light-emitting diode.
Figure 6:
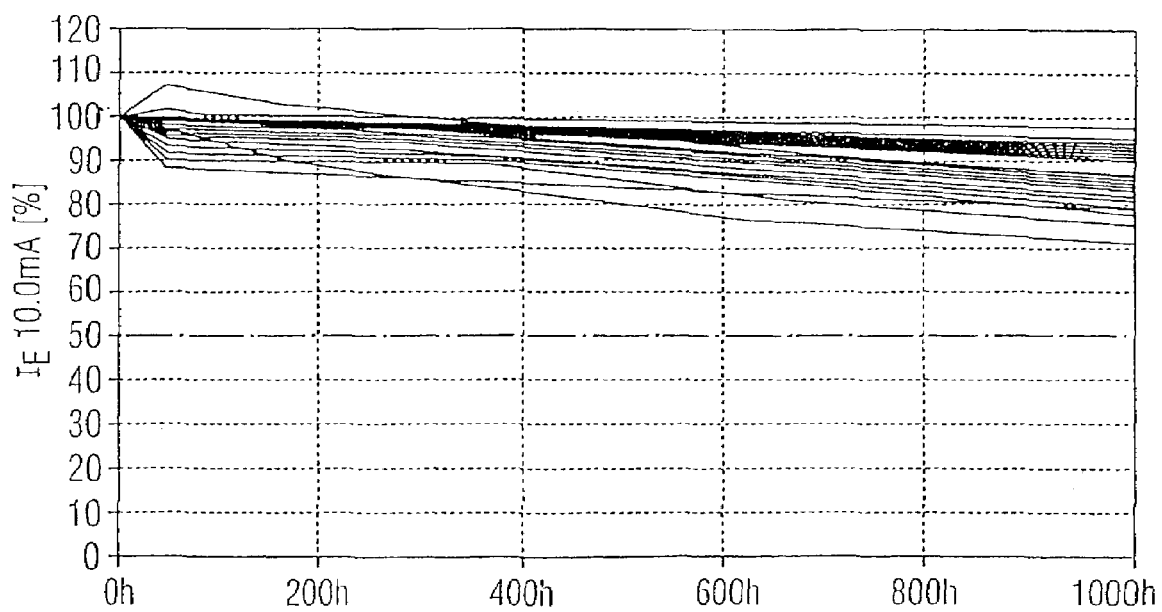
FIG. 6, a graph showing the relative degradation in the radiation intensity in pulsed operation of the light-emitting diode of the invention.

FIGS. 5 and 6, in which high-current aging is shown, demonstrate a similar performance.

In FIG. 5, measurements are shown for conventional semiconductor chips operated in pulsed mode. The duration of the pulses was 100 μs. The interval between pulses was selected as 3 ms. The conventional light-emitting diodes were loaded with a current of 1500 mA. It becomes clear from FIG. 5 that all the conventional light-emitting diode chips tested had less than 80% of the original radiation intensity after 1000 hours.

The performance of the light-emitting diode chips 1 of the invention is admittedly nonhomogeneous, but light-emitting diode chips 1 that have no degradation or only very slight degradation exist instead. Averaged over the individual samples, the degradation of light-emitting diode chips 1 according to the invention is therefore substantially less than in conventional light-emitting diode chips.

It should be noted that the light-emitting diode described is especially suitable for emitting light in the infrared spectral range.

The invention claimed is:

1. A light-emitting diode having a semiconductor chip based on GaAlAs, with an amphoterically doped diode layer series that has a P-doped anode layer and an n-doped cathode layer, and having an n-doped window layer based on GaAlAs adjoining the n-doped cathode layer, wherein
   the thickness of the window layer is between 15 μm and 25 μm;
   the window layer is doped with the aid of Si or Sn with a net concentration of less than $1\times10^{18}$ cm$^{-3}$; and
   doping of the window layer is substantially free of tellurium.

2. The light-emitting diode of claim 1, wherein the concentration of aluminum in the window layer is less than 24 atom-%.

3. The light-emitting diode of claim 2, wherein the concentration of aluminum in the window layer is less than 24 atom-%.

4. A method for producing a light-emitting diode having a semiconductor chip based on GaAlAs, with a diode layer series amphoterically doped with the aid of silicon, which series has a p-doped anode layer and an n-doped cathode layer, and having an n-doped a window layer based on GaAlAs adjoining the n-doped cathode layer, comprising:
   forming the thickness of the window layer to be between 15 μand 25 μm; and
   doping the window layer with the aid of Si or Sn with a net concentration of less than $1\times10^{18}$ cm$^{-3}$;
   wherein said doping of the window layer is substantially free of tellurium.

* * * * *

UNITED STATES PATENT AND TRADEMARK OFFICE
CERTIFICATE OF CORRECTION

| | |
|---|---|
| PATENT NO. | : 7,307,284 B2 |
| APPLICATION NO. | : 10/332259 |
| DATED | : December 11, 2007 |
| INVENTOR(S) | : Günther Grönninger |

It is certified that error appears in the above-identified patent and that said Letters Patent is hereby corrected as shown below:

Please correct col. 4 line 12, to read as follows:

--series that has a [[P-doped]] p-doped anode layer and an n-doped--

Claim 3 (cancelled).

Please correct col. 4, line 34, to read as follows:

--15 [[μand]] μm and 25 μm; and--

Signed and Sealed this

Thirteenth Day of May, 2008

JON W. DUDAS
*Director of the United States Patent and Trademark Office*